(12) United States Patent
Bidinost et al.

(10) Patent No.: US 9,480,178 B2
(45) Date of Patent: Oct. 25, 2016

(54) METHOD FOR FORMING A COMPONENT OF A VEHICLE LATCH ASSEMBLY

(71) Applicants: Mauro P. Bidinost, El Paso, TX (US); Hector Sanchez Rojas, Ciudad Juarez (MX)

(72) Inventors: Mauro P. Bidinost, El Paso, TX (US); Hector Sanchez Rojas, Ciudad Juarez (MX)

(73) Assignee: INTEVA PRODUCTS, LLC, Troy, MI (US)

( * ) Notice: Subject to any disclaimer, the term of this patent is extended or adjusted under 35 U.S.C. 154(b) by 38 days.

(21) Appl. No.: 14/046,465

(22) Filed: Oct. 4, 2013

(65) Prior Publication Data

US 2014/0034381 A1 Feb. 6, 2014

Related U.S. Application Data

(62) Division of application No. 12/879,331, filed on Sep. 10, 2010, now Pat. No. 8,558,124.

(60) Provisional application No. 61/241,190, filed on Sep. 10, 2009.

(51) Int. Cl.
*H01K 3/22* (2006.01)
*H05K 7/02* (2006.01)
(Continued)

(52) U.S. Cl.
CPC ........... *H05K 7/02* (2013.01); *B29C 45/14639* (2013.01); *B29C 45/1671* (2013.01); *E05B 81/54* (2013.01); *E05B 85/02* (2013.01); *B29L 2031/30* (2013.01); *E05B 2015/1664* (2013.01)

(58) Field of Classification Search
CPC .................... B29C 45/14639; B29C 45/1671; B29L 2031/30; E05B 81/54; E05B 2015/1664; E05B 85/02; H05K 7/02

USPC ......... 29/751, 753, 748, 747, 761, 861, 863, 29/857; 174/521; 264/255
See application file for complete search history.

(56) References Cited

U.S. PATENT DOCUMENTS

| | | |
|---|---|---|
| 4,965,410 A | 10/1990 | Spector |
| 4,965,933 A | 10/1990 | Mraz et al. |

(Continued)

FOREIGN PATENT DOCUMENTS

| | | |
|---|---|---|
| CN | 1121304 A | 4/1996 |
| CN | 1241500 A | 1/2000 |

(Continued)

OTHER PUBLICATIONS

International Search Report dated May 20, 2011 for International Application No. PCT/US2010/048380.

(Continued)

*Primary Examiner* — Paul D Kim
(74) *Attorney, Agent, or Firm* — Cantor Colburn LLP

(57) ABSTRACT

A component for a vehicle latch assembly is provided, the component having: an electrical sub-system having a plurality of circuit paths each being electrically connected to a common ground, the electrical sub-system being molded into a pre-mold by a first molding process, the pre-mold comprising an encapsulation layer molded around the common ground and an at least one structural member secured to the encapsulation layer and at least one of the plurality of circuit paths, the structural member providing rigidity to the pre-mold; and a plurality of locating features extending from at least one of the encapsulation layer and the structural member.

8 Claims, 3 Drawing Sheets

(51) Int. Cl.
  *B29C 45/14* (2006.01)
  *B29C 45/16* (2006.01)
  *E05B 85/02* (2014.01)
  *E05B 81/54* (2014.01)
  *B29L 31/30* (2006.01)
  *E05B 15/16* (2006.01)

(56) References Cited

U.S. PATENT DOCUMENTS

| | | | |
|---|---|---|---|
| 5,281,762 A | 1/1994 | Long et al. | |
| 5,462,622 A | 10/1995 | Small et al. | |
| 5,474,339 A * | 12/1995 | Johnson | E05B 81/06 292/201 |
| 5,503,441 A * | 4/1996 | Schwaiger | E05B 81/54 292/142 |
| 5,577,782 A * | 11/1996 | Johnson | E05B 81/06 292/201 |
| 6,323,430 B1 | 11/2001 | Finona | |
| 6,786,530 B2 * | 9/2004 | Fisher | E05B 81/14 296/146.1 |
| 7,507,122 B2 | 3/2009 | Oh et al. | |
| 8,573,657 B2 * | 11/2013 | Papanikolaou | E05B 81/14 292/201 |
| 2009/0154182 A1 | 6/2009 | Veenstra et al. | |
| 2012/0171887 A1 | 7/2012 | Sebald et al. | |

FOREIGN PATENT DOCUMENTS

EP  0 955 191 A2  4/1999
KR  1020080040517 A  6/2009

OTHER PUBLICATIONS

Written Opinion dated May 20, 2011 for International Application No. PCT/US2010/048380.
English Translation of CN1241500A Abstract.
English Translation of CN1121304A Abstract.
Office Action for Chinese Patent Application No. 2010800401859.

* cited by examiner

US 9,480,178 B2

METHOD FOR FORMING A COMPONENT OF A VEHICLE LATCH ASSEMBLY

CROSS REFERENCE TO RELATED APPLICATIONS

This application is a divisional application of U.S. patent application Ser. No. 12/879,331 filed Sep. 10, 2010, now U.S. Pat. No. 8,558,124, which claims the benefit of U.S. Provisional Patent Application Ser. No. 61/241,190 filed Sep. 10, 2009, the contents each of which are incorporated herein by reference thereto.

TECHNICAL FIELD

Exemplary embodiments of the present invention are directed to a component for a vehicle latch assembly and method of manufacture.

BACKGROUND

Most vehicles have a door latch assembly that is a combination of a mechanical system and an electrical system. The primary function of the mechanical system is to keep the vehicle door closed and locked while also providing a means for opening or unlocking the door. The primary function of the electrical system in the latch is to provide a signal or signals to a control unit or controller wherein the signals are indicative of any one of a number of various positional elements of the latching system including but not limited to the vehicle's door position and locking and latching status of the mechanical system. These signals are provided by sensors or switches that are typically exposed to various environmental conditions and the historical performance such systems have exhibited a distinct need to function flawlessly in wet environments.

Accordingly, it is desirable to provide a door latch assembly with a plurality of sensors or switches that are not susceptible to the deleterious effect of a wet environment.

SUMMARY

In one exemplary embodiment, a component for a vehicle latch assembly is provided, the component having: an electrical sub-system having a plurality of circuit paths each being electrically connected to a common ground, the electrical sub-system being molded into a pre-mold by a first molding process, the pre-mold comprising an encapsulation layer molded around the common ground and an at least one structural member secured to the encapsulation layer and at least one of the plurality of circuit paths, the structural member providing rigidity to the pre-mold; and a plurality of locating features extending from at least one of the encapsulation layer and the structural member.

In another exemplary embodiment, a component for a vehicle latch assembly is provided, the component having an electrical sub-system having a plurality of circuit paths each being electrically connected to a common ground, the electrical sub-system being molded into a pre-mold by a first molding process wherein the common ground is encapsulated by an insulating layer; and a housing component molded over the pre-mold by a second molding process.

In another exemplary embodiment, a method for forming a component of a vehicle latch assembly is provided, the method including the steps of: placing an electrical sub-system having a plurality of circuit paths each being electrically connected to a common ground in a mold; molding the electrical sub-system into a pre-mold by a first molding process wherein the common ground is encapsulated by an insulating layer; and molding a housing component over the pre-mold by a second molding process.

In yet another embodiment, a method for forming a component of a vehicle latch assembly is provided. The method including the steps of: placing an electrical sub-system having a plurality of circuit paths each electrically connected to a common ground in a mold; and molding the electrical sub-system into a pre-mold by a first molding process wherein only the common ground is encapsulated by an insulating layer, wherein the pre-mold has at least one structural member secured to the insulating layer and at least one of the plurality of circuit paths, the structural member providing rigidity to the pre-mold and wherein the pre-mold further comprises a plurality of locating features extending away from at least one of the insulating layer and the structural member.

The above described and other features are exemplified by the following figures and detailed description.

DRAWINGS

Referring now to the FIGS., wherein exemplary embodiments are illustrated and like elements are numbered alike:

DETAILED DESCRIPTION

In one exemplary embodiment a component for a vehicle latch assembly is provided, the component having an electrical sub-system having a plurality of circuit paths each being electrically connected to a common ground, the electrical sub-system being molded into a pre-mold by a first molding process, the pre-mold comprising an encapsulation layer molded around the common ground and at least one structural member secured to the encapsulation layer and at least one of the plurality of circuit paths, the structural member providing rigidity to the pre-mold; and a plurality of locating features extending from the encapsulation layer and/or and the structural member.

It is the improvement of performance and reliability of this electrical sub-system that is the purpose of exemplary embodiments of this invention.

The latch assembly is comprised of many components, including components that carry the sensors that provide input to the electrical system. This can be the latch assembly, cover assembly, and or housing component assembly (see FIGS. 1-4). The electrical sub-system consists of circuit paths containing leads to switches, motors, and the terminal connector body. It is imperative that the individual circuits be isolated so as to not allow for a short circuit when exposed to the environmental conditions experienced by the vehicle into which the latch assembly is installed. The latch assembly must meet the product requirements in durability testing and, of course, in the field. Failure to properly isolate the circuits will result in false signals to the vehicle resulting in driver dissatisfaction and potentially increased warranty cost.

These components are typically formed by a thermoplastic which may be used in an injection molding process such as a plastic injection molding process or equivalents thereof. Of course, other equivalent materials and molding processes are contemplated. An exemplary embodiment of this invention provides for the isolation of critical leads of the electrical subsystem by an encapsulation process within the applicable component including but not limited to the cover assembly and implemented during the molding process. The intent of this method and apparatus of the present invention is to seal the leads from the elements by a plastic material during a first injection molding process. As discussed above a failure occurs when moisture enters and bridges a gap between the various electrical leads or circuit paths required to perform the multiple functions required. This bridgeable gap is eliminated by exemplary embodiments of the present invention.

Figure 1:
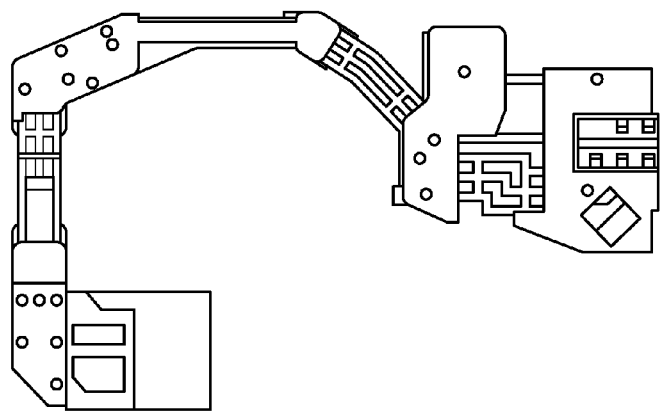
FIGS. 1 and 2 are top and bottom views of a pre-mold of an electrical sub-assembly.
Figure 2:
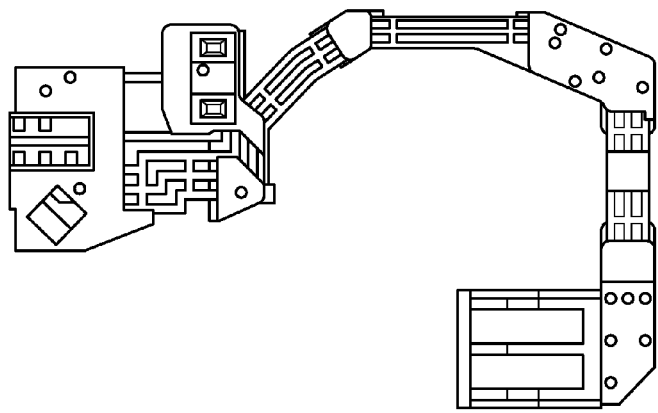
Figure 5:
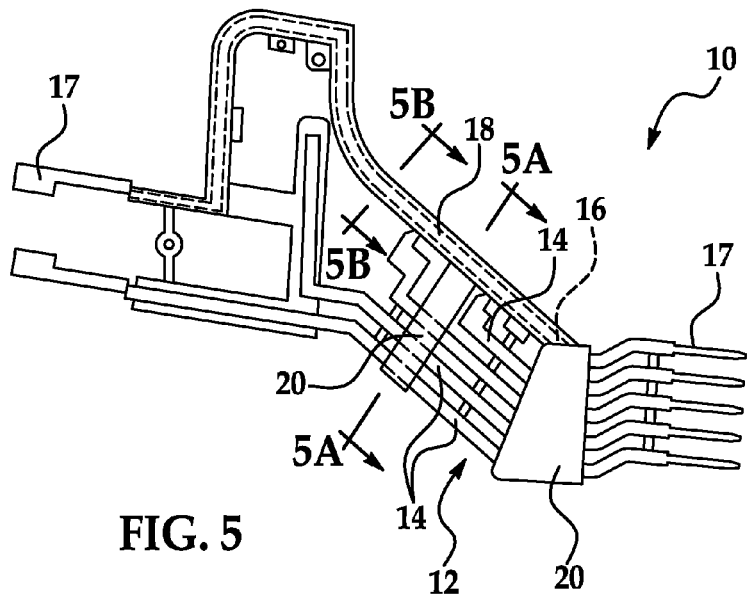
FIGS. 5-7 illustrate a pre-mold electrical sub-assembly or system in accordance with an exemplary embodiment of the present invention.
Figure 5A:
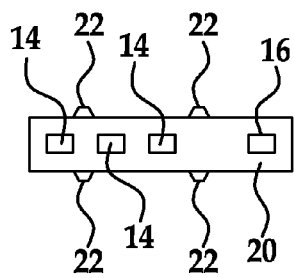
Figure 5B:
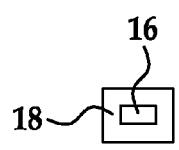
Figure 5C:
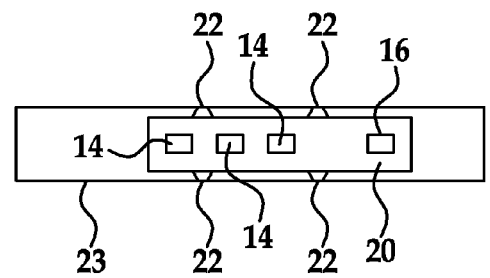
Figure 6:
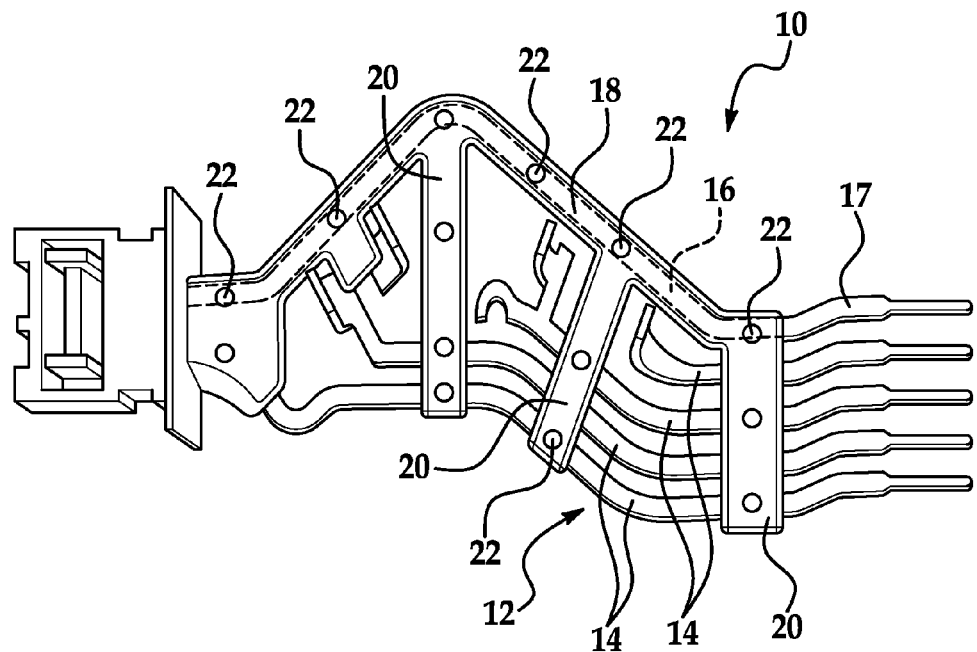
Figure 7:
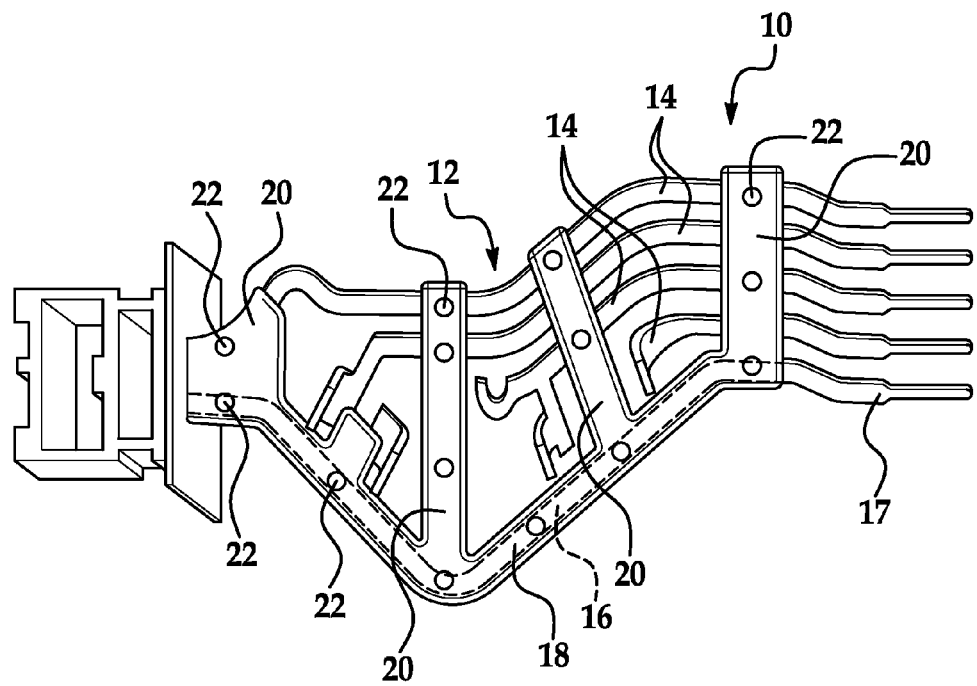

A molded cover assembly or any other molded component with an electrical sub-system having a first pre-mold in accordance with an exemplary embodiment of the present invention is made in a two step process. First the electrical leads are placed in a first mold to create a pre-mold via a plastic injection molding process or equivalent thereof. FIGS. 1 and 2 as well as FIGS. 5-7 illustrate pre-molds of the electrical leads. The pre-mold binds the leads together at strategic locations in order to make the leads easier to handle for the subsequent operation. Moreover, the leads are configured for use in the latch assembly. This pre-mold is then loaded into a second mold, which in one embodiment is a component of a latch assembly although other components are considered to be within the scope of various embodiments of the present invention.

Figure 3:
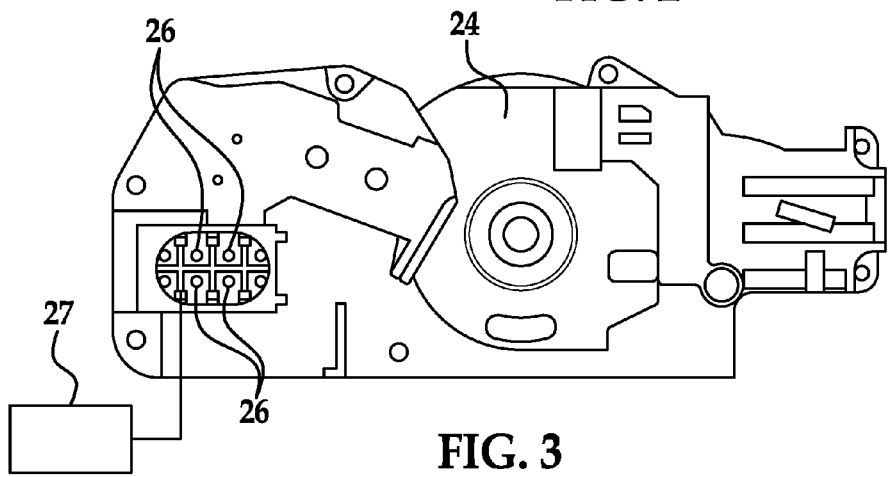
FIGS. 3 and 4 show a housing component molded over a pre-mold electrical sub-assembly or system.
Figure 4:
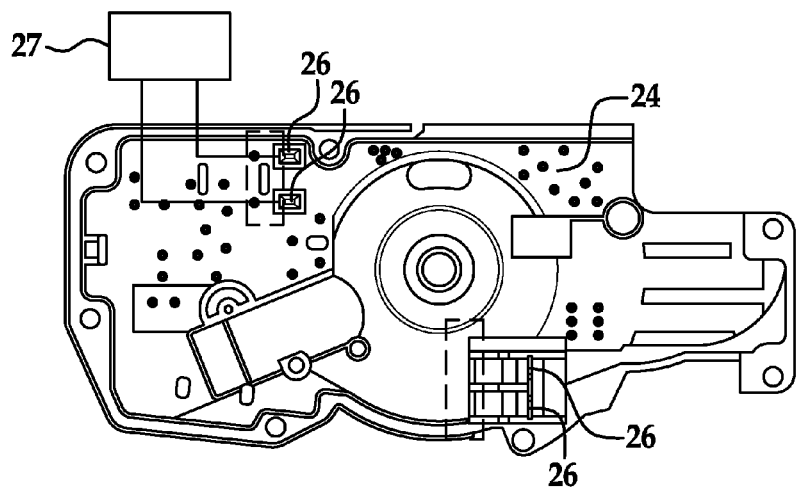

Plastic is then injected into the second mold and flows around the pre-mold and the final shape of the cover plate or component is realized. At least FIGS. 3 and 4 illustrate a cover plate or component formed by the second mold. Of course, other alternative configurations of the cover plate as well as other components are considered to be with the scope of the various embodiments of the present invention and the same is not intended to be limited to the specific configurations illustrated in the attached FIGS.

As discussed above, a failure of one of the electrical leads or circuits can occur when moisture penetrates the encapsulation of the cover plate formed by the second mold and bridges a gap between two leads thus creating a short circuit. Inherent with the two step method of molding is the generation of boundaries between the pre-mold and the over-mold. These boundaries or interfaces between the first pre-mold and the second mold are potential "leak points" for moisture to enter the encapsulation and subsequently create a short circuit.

Another potential leak point is at the interface created by the separate non-integrally formed locating devices that are required to correctly position the pre-mold on the over-mold or second mold and also secure it during the injection of plastic into the over-mold. Some of these potential leak points are illustrated by the dashed lines in FIG. 4 and due to temperature gradients and thermal expansion, moisture has been shown to enter the encapsulation and boundary locations.

Alternative options for preventing the aforementioned short circuits exist however these options which include insulated wires, flexible circuits, and external coatings are not cost effective solutions.

Accordingly, it is desirable to provide an electrical system that can function in more severe environments without the use of the aforementioned cost prohibitive processes and/or items.

Exemplary embodiments of the present invention take the approach of protecting the circuit from moisture intrusion with a significant difference. In accordance with an exemplary embodiment, a ground circuit of the electrical subsystem of the pre-mold is encapsulated in a unique pre-mold process potentially including multi-shot tools (See FIGS. 5-7) wherein an additional layer of protection is added via an over-mold. The theory behind exemplary embodiments of the present invention is that if the ground (common) is totally isolated thus, a short circuit cannot occur regardless of the amount of moisture intrusion into the latch assembly.

As illustrated in FIGS. 5-7 a component 10 for a vehicle latch assembly is provided. The component has an electrical sub-system 12 that has a plurality of circuit paths or conductors 14 each connected to a common ground 16. The electrical sub-system is molded into a pre-mold illustrated in FIGS. 5-7 by a first molding process. The first molding process provides an encapsulation layer 18 that is completely molded around the common ground 16 except for an end portion 17, which may be required to terminate with an electrical component coupled to the sub-system 12 outside of the sub-system or the latch assembly. Alternatively, the common ground including the end portion(s) 17 are completely encapsulated by the first molding process. Moreover, the first molding process isolates the common ground from the other circuits or conductors 14 in a cost efficient manner.

The first molding process also provides at least one structural member 20 to provide rigidity to the system. Of course, multiple structural members 20 that are discretely located are also contemplated. In one embodiment, the structural member is also secured to the encapsulation layer and at least one of the plurality of circuit paths. Still further, a plurality of structural members may be located in various discrete locations about the sub-system.

In one exemplary embodiment, the thermoplastic material used for the first molding process of the pre-mold is a glass filled polypropylene. Of course, other suitable materials are contemplated for use in exemplary embodiments of the present invention. Once formed by the first molding process, the structural member provides rigidity to the pre-molded component.

For example and as illustrated in the attached FIGS., the at least one structural member 20 is secured to each of the circuit paths or conductors however, the entire path exclusive of the common ground is not encapsulated. Various configurations are also contemplated the structural member surround the relative portion of the circuit paths or conductors 14 or may simply secured to the upper and lower portions of the circuit path or conductors 14.

Still further and in alternative exemplary embodiment, a plurality of locating features 22 are integrally formed on the at least one structural member 20 or members 20 and in some embodiments the encapsulation layer 18 that is formed by the first molding process, the plurality of locating features extend away from the encapsulation layer and the structural member.

In one embodiment, the plurality of locating features extend from both the upper and lower surface of the structural members and/or the encapsulation layer of the common ground. The locating features are configured to locate the component or pre-mold in a tool or second mold 23 wherein the component is encapsulated by a second molding process that forms a housing component 24, such as a cover plate of a housing or any other portion of a housing around the component 10. The use of the integrally molded locating features negates the need for separate locating devices, as discussed above, that were required to correctly position the pre-mold in the second mold and secure it during the injection of plastic in the second mold, which as mentioned above, may provide potential leak points at the interface created during the injection molding process. As referred to herein the first molding process and the second molding process are a plastic injection molding process or equivalent thereof. Of course, other suitable molding processes are considered to be within the scope of exemplary embodiments of the present invention.

In accordance with various embodiments of the present invention, the locating features may be integrally formed on anyone of the structural members 20, the encapsulation layer 18 including either the upper or lower surfaces thereof or both the upper and lower surfaces thereof.

FIGS. 3 and 4 illustrate an example of a housing component 24. In other words, the locating features position the pre-mold in a mold cavity prior to the application of the second molding process.

Other alternatives contemplate the plurality of locating features extending from only the upper or lower surface of the structural member(s) and/or the encapsulation layer or any combinations thereof. Still further, the plurality of locating features may comprise nub or protrusion or any other equivalent feature that extends from a surface of the structural member(s) and/or the encapsulation layer in order to locate the pre-mold into the mold used for the second molding process.

After the second molding process, terminals 26 electrically connected to at least one of the plurality of circuit paths extend from the housing component. Terminals 26 are then electrically coupled to any one of a plurality of components 27 (e.g., switches, sensors, electrical harnesses, etc.) that are secured to the electrical sub system.

Although, a component 10 for a vehicle latch assembly is illustrated herein. It is, of course, understood that exemplary embodiments of the present invention are considered to be applicable to any component having an electrical sub-system 12 that has a plurality of circuit paths or conductors 14 each connected to a common ground 16, wherein the common ground is encapsulated by a first molding process to form a pre-mold and wherein the pre-mold is then subsequently inserted into a second mold to form the component with a second molding process. Still further and in alternative embodiments, the first molding process will provide integrally formed locating features on the first pre-mold in order to locate it with the mold or tool of the second molding process, which forms the component, which again can have any configuration and does not have to be specifically limited to housings for vehicle latches although a housing component of a vehicle latch is one contemplated embodiment.

While the invention has been described with reference to an exemplary embodiment, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A method for forming a component of a vehicle latch assembly, the method comprising:
   placing an electrical sub-system having a plurality of circuit paths each electrically connected to a common ground in a mold;
   molding the electrical sub-system into a pre-mold by a first molding process wherein only the common ground is encapsulated by an insulating layer; and
   molding a housing component over the pre-mold by a second molding process.

2. The method as in claim 1, wherein the electrical sub-system has at least one terminal extending outwardly from the housing component and the first molding process and the second molding process are plastic injection molding processes.

3. The method as in claim 1, wherein the pre-mold further comprises at least one structural member secured to the insulating layer and at least one of the plurality of circuit paths, the structural member providing rigidity to the pre-mold.

4. The method as in claim 3, wherein the first molding process forms a plurality of locating features extending away from at least one of the insulating layer and the structural member, wherein the plurality of locating features are configured to locate the component in a tool when the component is encapsulated by the second molding process.

5. The method as in claim 4, wherein the electrical sub-system has at least one terminal extending outwardly from the housing component and the first molding process and the second molding process are plastic injection molding processes.

6. The method as in claim 3, wherein the plurality of circuit paths are not encapsulated by the insulating layer and the structural member only partially covers the at least one of the plurality of circuit paths.

7. The method as in claim 1, wherein the electrical sub-system further comprises a terminal electrically connected to at least one of the plurality of circuit paths, the terminal extending from the housing component.

8. The method as in claim 1, wherein the first molding process forms a plurality of locating features extending away from at least one of the insulating layer and the structural member, wherein the plurality of locating features are configured to locate the component in a tool when the component is encapsulated by the second molding process.

* * * * *